United States Patent
Khater et al.

(10) Patent No.: US 10,122,478 B2
(45) Date of Patent: Nov. 6, 2018

(54) METHODS AND DEVICES FOR REAL-TIME MONITORING OF TUNABLE FILTERS

(71) Applicant: Purdue Research Foundation, West Lafayette, IN (US)

(72) Inventors: Mohammad Abu Khater, West Lafayette, IN (US); Dimitrios Peroulis, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 15/057,072

(22) Filed: Feb. 29, 2016

(65) Prior Publication Data
US 2017/0201335 A1    Jul. 13, 2017

Related U.S. Application Data

(60) Provisional application No. 62/121,548, filed on Feb. 27, 2015.

(51) Int. Cl.
*H04B 17/21* (2015.01)
*H04B 3/04* (2006.01)
(Continued)

(52) U.S. Cl.
CPC ............ *H04B 17/21* (2015.01); *G01R 1/24* (2013.01); *G01R 23/02* (2013.01);
(Continued)

(58) Field of Classification Search
CPC . H04B 17/21; H04B 3/04; G01R 1/24; G01R 23/02; H03H 7/01; H03H 7/0123;
(Continued)

(56) References Cited

U.S. PATENT DOCUMENTS 4,006,461 A * 2/1977 Coulter ................... G01S 1/024
  379/40
6,239,673 B1 * 5/2001 Wenzel ................. H01P 1/2084
  333/202

(Continued)

OTHER PUBLICATIONS

Liu, X., et al., "High-Q Tunable Microwave Cavity Resonators and Filters Using SOI-Based RF MEMS Tuners." Journal of Microelectromechanical Systems, vol. 19, No. 4, 774-784, 2010.
Naglich, E.J., et al., "Bandpass—Bandstop Filter Cascade Performance Over Wide Frequency Tuning Ranges." IEEE Transactions on Microwave Theory and Techniques, vol. 58, No. 12, 3945-3953, 2010.

(Continued)

*Primary Examiner* — Neel Shah
(74) *Attorney, Agent, or Firm* — Purdue Research Foundation (57) ABSTRACT

Methods and devices suitable for monitoring the frequency of microwave tunable filters in real time. The frequency readout relies on the natural response of such a filter when excited by a pulse. Methods of measuring an operating frequency of a pole in a tunable filter include measuring a number of cycles in a natural response in the filter when the filter is excited by an electric current pulse, and determining a resonance frequency based on the number of cycles measured in the natural response. Such a method can provide the operating frequency information in a binary digital format, making it relatively easy to read and process. A measuring resonator may be mounted to the filter resonator and connected by a common actuator.

5 Claims, 9 Drawing Sheets

(51) Int. Cl.
*G01R 1/24* (2006.01)
*G01R 23/02* (2006.01)
*H03H 7/01* (2006.01)
*H03K 19/21* (2006.01)
*H03K 3/282* (2006.01)
*H01P 1/20* (2006.01)
*H01P 1/207* (2006.01)
*H01P 1/208* (2006.01)

(52) U.S. Cl.
CPC ........... *H03H 7/1775* (2013.01); *H03K 19/21* (2013.01); *H03H 2007/013* (2013.01)

(58) Field of Classification Search
CPC ........ H03H 7/17; H03H 7/1775; H03K 19/21; H03K 3/282; H01P 1/20; H01P 1/207; H01P 1/208; H01P 1/2084
See application file for complete search history.

(56) References Cited

U.S. PATENT DOCUMENTS

| | | | | |
|---|---|---|---|---|
| 8,941,443 | B1* | 1/2015 | Newgard | H03B 5/32 331/117 R |
| 2003/0025569 | A1* | 2/2003 | Tiihonen | H01P 7/10 333/17.1 |
| 2006/0250145 | A1* | 11/2006 | Kobbe | G01D 5/34738 324/691 |
| 2010/0321132 | A1* | 12/2010 | Park | H01P 1/127 333/186 |
| 2011/0241802 | A1* | 10/2011 | Joshi | H01P 1/219 333/209 |
| 2017/0040978 | A1* | 2/2017 | Hoppenjans | H01P 1/2053 |

OTHER PUBLICATIONS

Tuttlebee, W.H.W., "Software-Defined Radio: Facets of a Developing Technology." IEEE Personal Communications, 38-44, 1999.
Peroulis, D., et al., "Tunable Lumped Components with Applications to Reconfigurable MEMS Filters." 2001 IEEE MTT-S Digest, 341-344, 2001.
Yan, W.D., et al., "Tunable Dielectric Resonator Bandpass Filter With Embedded MEMS Tuning Elements." IEEE Transactions on Microwave Theory and Techniques, vol. 55, No. 1, 154-163, 2007.
Findikoglu, A.T., et al., "Tunable and adaptive bandpass filter using a nonlinear dielectric thin film of SrTiO3." Applied Physics Letters 68, 1651 (1996).
Al-Ahmad, M., et al., "Wide Piezoelectric Tuning of LTCC Bandpass Filters." IEEE,1275-1278, 2005.
White J.R., et al., "Octave-Tunable Miniature RF Resonators." IEEE Microwave and Wireless Components Letters, vol. 15, No. 11, 793-795, 2005.
Hajela, S., et al., "Widely Tunable High-Q Evanescent-Mode Resonators Using Flexible Polymer Substrates." IEEE 2139-2142, 2005.
Joshi, H., et al., "Highly Loaded Evanescent Cavities for Widely Tunable High-Q Filters." IEEE 2133-2136, 2007.
Dunsmore, J. "Tuning Band Pass Filters in the Time Domain." 1999 IEEE MTI-S Digest, 1351-1354, 1999.
Miraftab, V., et al., "Computer-Aided Tuning of Microwave Filters Using Fuzzy Logic." IEEE Transactions on Microwave Theory and Techniques, vol. 50, No. 12, 2781-2788, 2002.
Miraftab, V., et al., "Fully Automated RF/Microwave Filter Tuning by Extracting Human Experience Using Fuzzy Controllers." IEEE Transactions on Circuits and Systems—I: Regular Papers, vol. 55, No. 5, 1357-1367, 2008.

* cited by examiner

METHODS AND DEVICES FOR REAL-TIME MONITORING OF TUNABLE FILTERS

CROSS REFERENCE TO RELATED APPLICATIONS

The present patent application is related to and claims the priority benefit of U.S. Provisional Patent Application Ser. No. 62/121,548, filed Feb. 27, 2015, the contents of which is hereby incorporated by reference in its entirety into the present disclosure.

STATEMENT REGARDING FEDERALLY FUNDED RESEARCH

This invention was made with government support under Contract No. HR0011-12-C-0096 awarded by the Defense Advanced Research Projects Agency. The Government has certain rights in the invention.

TECHNICAL FIELD

The present application relates to microwave tunable filters and, more specifically, to methods of monitoring and tuning the frequency of high-Q microwave tunable filters in real time.

BACKGROUND

Tunable filters are the essence of emerging reconfigurable radios and spectrum-aware systems. Their capabilities of switching bands, changing communication standards, and handling jammers, among others, make them a very attractive choice for radio frequency (RF) front ends. Yet, the flexibility of tunable filters comes at the cost of being potentially vulnerable to variations in terms of frequency drift caused by aging or environmental effects. Such frequency stability issues can be addressed with high-Q cavity filters that are tunable using equipment such as network analyzers or by monitoring other operating modes, e.g., secondary mode, in the cavity of the filter. However, these tuning methods can be costly and time-consuming processes. Accordingly, there is a need for improvements in the field.

SUMMARY

The present invention provides methods and devices suitable for monitoring the frequency of microwave tunable filters in real time. The frequency readout relies on the natural response of such a filter when excited by a pulse.

According to various aspects, an evanescent-mode RF filter is disclosed, comprising an RF filter resonator having a first membrane enclosing a first cavity, a monitoring resonator having a second membrane enclosing a second cavity, the monitoring resonator mounted opposing the filter resonator such that the first and second membranes are facing one another, a planar actuator mounted between the first and second membranes, and a power supply configured to apply a voltage bias signal to the actuator, the voltage bias signal causing the actuator to increase or decrease the operating frequency of the filter resonator. The filter may further comprise a pulse injection circuit operatively connected to an input of the monitoring resonator, the pulse injection circuit configured to supply a pulse signal to the monitoring resonator. The filter may further comprise a readout circuit connected to an output of the monitoring resonator, the readout circuit configured to determine a number of pulses from the output having a voltage greater than a predetermined threshold in a predetermined time period, the number of pulses corresponding to a natural response frequency of the filter resonator in response to the pulse signal.

Methods of measuring an operating frequency of a pole in a tunable filter include measuring a number of cycles in a natural response in the filter when the filter is excited by an electric current pulse, and determining a resonance frequency based on the number of cycles measured in the natural response. Such a method can provide the operating frequency information in a binary digital format, making it relatively easy to read and process.

BRIEF DESCRIPTION OF THE DRAWINGS

In the following description and drawings, identical reference numerals have been used, where possible, to designate identical features that are common to the drawings.

The attached drawings are for purposes of illustration and are not necessarily to scale.

DETAILED DESCRIPTION

Various aspects relate to electrostatic control of an ionic environment in a droplet based platform for biological applications. The terms "I," "we," "our" and the like throughout this description do not refer to any specific individual or group of individuals.

Throughout this description, some aspects are described in terms that would ordinarily be implemented as software programs. Those skilled in the art will readily recognize that the equivalent of such software can also be constructed in hardware, firmware, or micro-code. Because data-manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1:
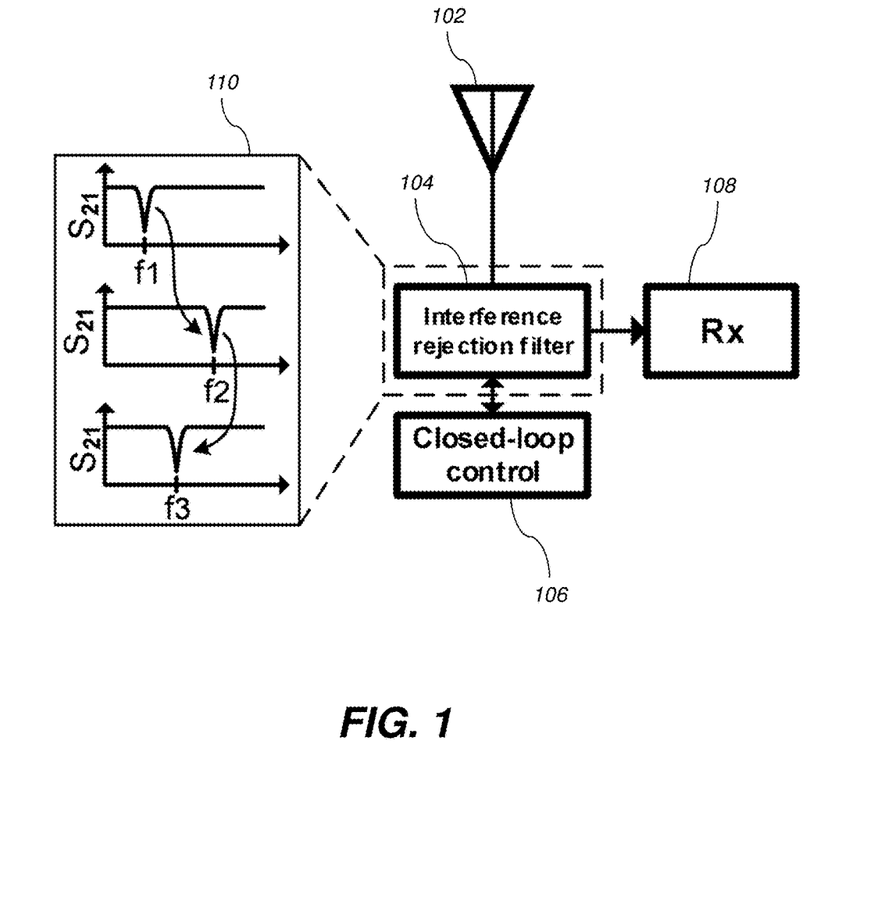
FIG. 1 is a diagram showing a communication system according to various aspects.

FIG. 1 shows a communication system 100, having an antenna 102 connected to an radio frequency (RF) cavity filter 104, a feedback control circuit 106 connected to the filter 104, and a receiver 108 connected to the filter 104. In certain embodiments, the filter 104 may comprise an evanescent-mode cavity filter. In operation, the antenna 102 receives radio frequency signals and directs them to the filter 104. The control circuit 102 tunes the filter 104 to a desired frequency or frequencies 110 and holds the filter 104 at that frequency, regardless of effects from hysteresis or creep. The control circuit 106 may operate on poles of the filter 104 independently, without interfering with the received RF signal. In certain embodiments, the control circuit 102 is configured to tune the filter 104 with a resolution of 33 MHz to 6 MHz (3.5-0.4%) in the frequency range of 0.9-1.45 GHz. In other embodiments, the resolution may be 20 MHz to 2 MHz (0.13-1.3%). The frequency range may include RF signals in the 1 GHz to 5 GHz range. The frequency range may also include microwave signals in the 300 MHz to 300 GHz range.

Figure 2A:
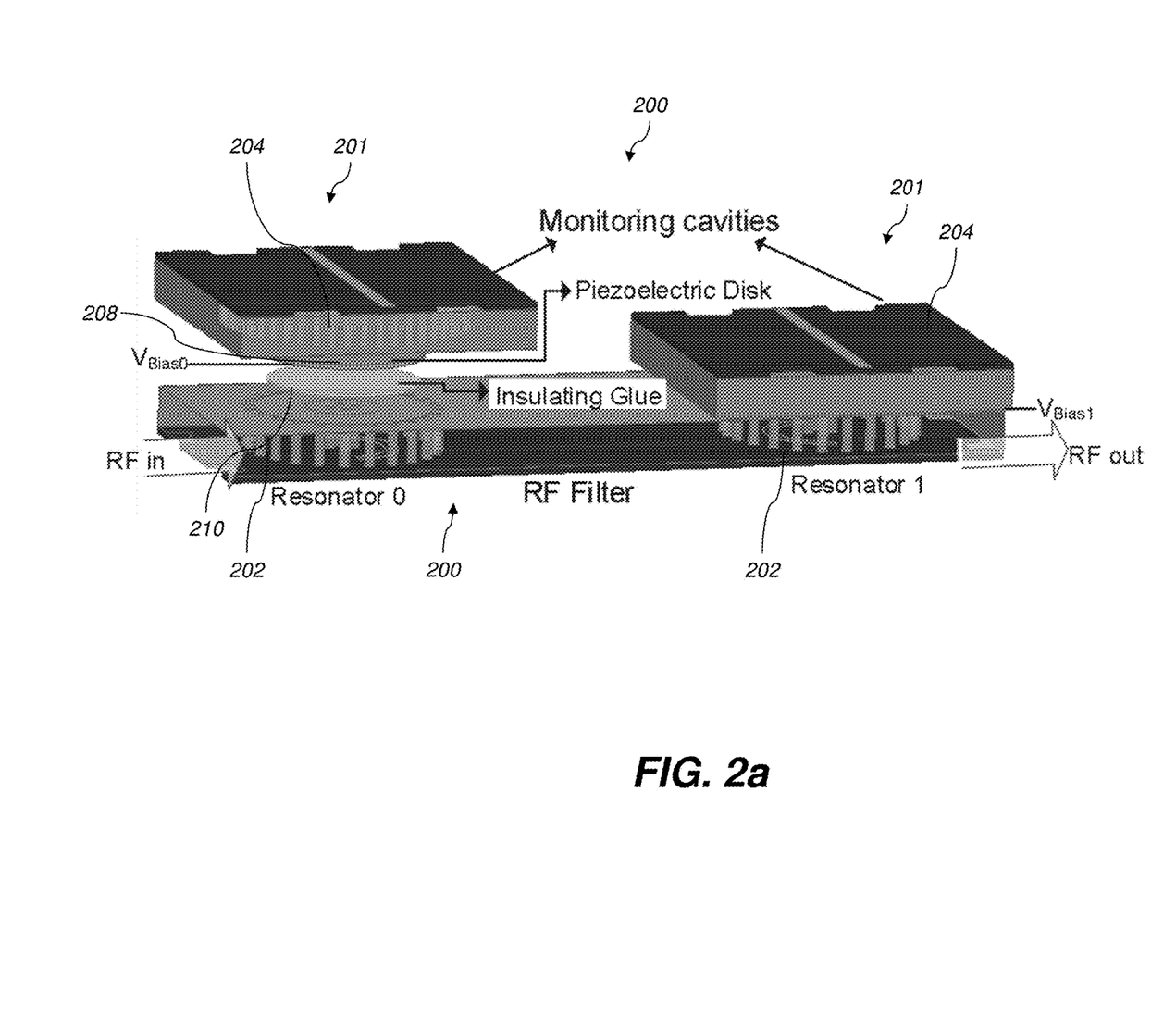
FIG. 2a is a perspective view diagram of an RF filter monitoring system according to various aspects.
Figure 2B:
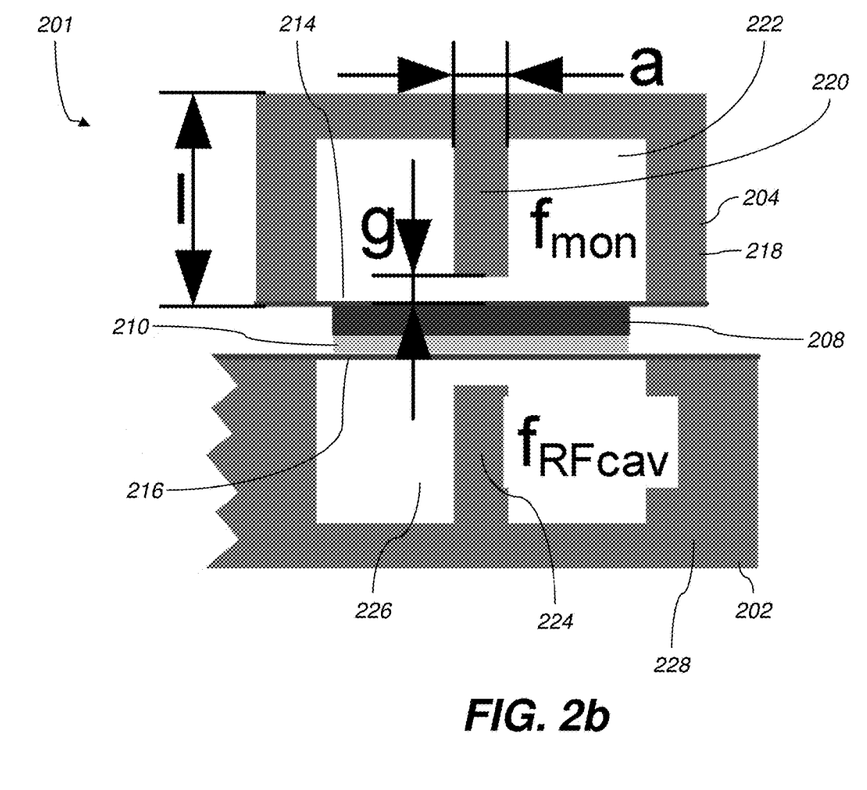
FIG. 2b is a cross-sectional side view of a monitoring device according to various aspects.

FIG. 2(a) shows a diagram of an evanescent-mode cavity filter 200 having a monitoring device 201 for monitoring each pole the filter 200 (illustrated here as a two pole filter). A cross-sectional side view of the monitoring device 201 is shown in FIG. 2(b). As shown, the monitoring device 201 comprises a monitoring cavity resonator 204 stacked on top of each filter resonator 202 of the filter 200 in an opposing fashion. The monitoring resonator 204 comprises rigid housing 218, a post 220 and a membrane 214 which encloses a cavity 222. The filter resonator 202 comprises a rigid housing 228, a post 224 and a membrane 216 which encloses a cavity 226. The bottom side of the membrane 214 of monitoring resonator 204 is mounted to a top side of an actuator, such as piezoelectric disk 208 to which a voltage bias is applied to tune the filter 200. The bottom side of the piezoelectric disk 208 is mounted to a top side of the membrane 216 of the filter resonator 202. It shall be understood that separate monitoring devices 201 may be used for the different poles (filter resonators) in the filter 200.

The piezoelectric disk 208 is electrically isolated from the membrane 216 by an insulating material 210, which in one embodiment is an electrically insulating glue. The glue is applied in a thin layer, allowing mechanical attachment without having a large impact on the tuning range of the piezoelectric disk 208. The piezoelectric disk 208 may also be electrically insulated from the membrane 214.

Figure 2C:
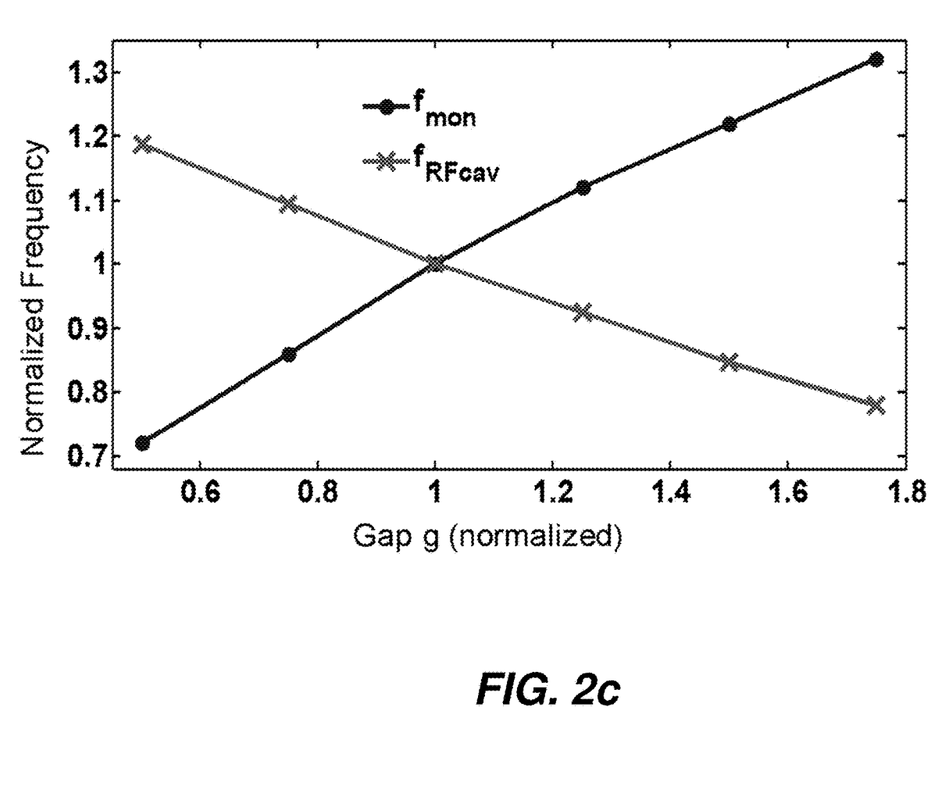
FIG. 2c is a plot showing the relationship between resonator gaps for a filter resonator and monitoring resonator according to various aspects.

Since the resonant frequency of each resonator 222 and 226 is controlled by the gap g (see FIG. 2(b)) between the post and the membrane (as shown in FIG. 2(c)), and since the gaps of both cavities 222 and 226 are controlled by the same actuator (e.g., piezoelectric disk 208), the resonant frequency of the monitoring resonator 204 ($f_{mon}$) will change whenever the resonant frequency of the bottom filter cavity 226 ($f_{RFcav}$) changes. Hence, monitoring the frequency of one cavity reveals the frequency of the other. This technique is not susceptible to hysteresis, creep or temperature effects, since any changes in one cavity will be reflected in the other.

The relationship between the resonant frequency of a cavity and its gap is given by $$f \approx \frac{1}{2\pi\sqrt{LC}} \approx \frac{1}{2\pi}\sqrt{\frac{g}{e_0 AL}}. \tag{1}$$

Where L and C are the effective inductance and capacitance of the cavity, respectively, g is the gap between the post and the membrane, and A is the area of the top of the post. The approximation in equation (1) is due to the parallel plate approximation of the capacitor.

Figure 2D:
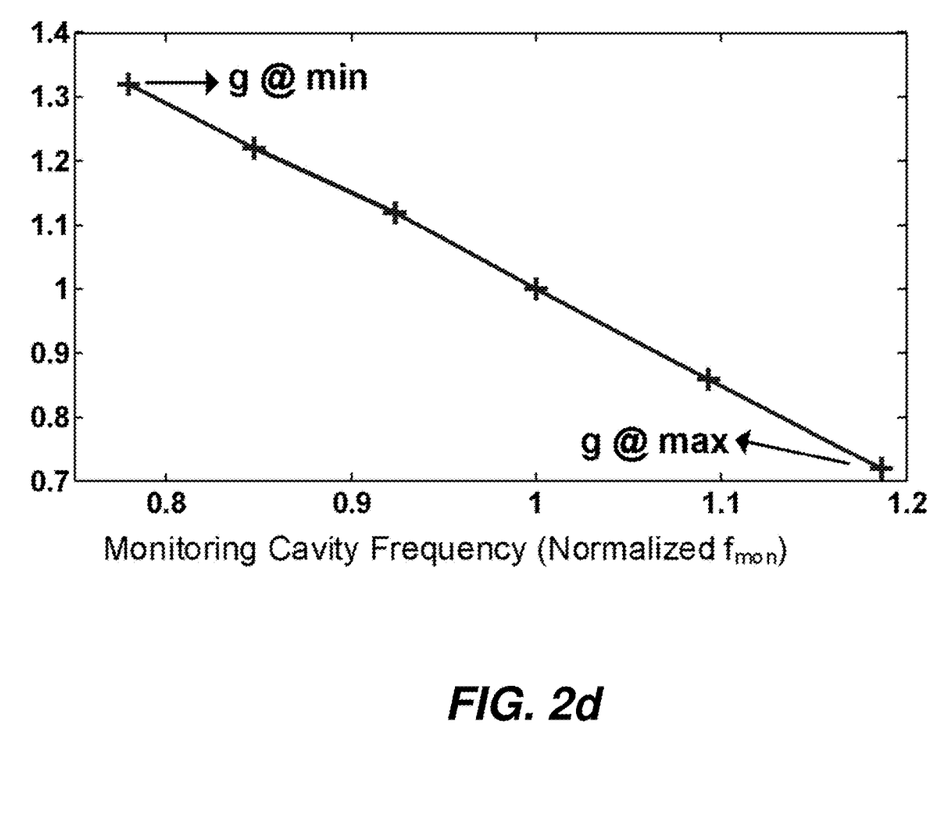
FIG. 2d is a plot showing the relationship between filter resonator and monitoring resonator frequencies when the gap changes according to various aspects.

From equation (1), the relationship between the resonant frequency of a cavity and the gap between the post membrane is monotonic and bijective (one-to-one correspondence). By transitivity, the relationship between the two resonant frequencies of the filter resonator 202 and monitoring resonator 204 is also monotonic and bijective. This relationship is shown in FIG. 2(d).

The frequency of the monitoring cavity 222 may be equal to, greater, or smaller than the frequency of the RF filter cavity 226. This is also due to the monotonic relationship between the two frequencies. In addition, since the monitoring and the RF paths are separated, each cavity can be optimized independently.

Figure 3:
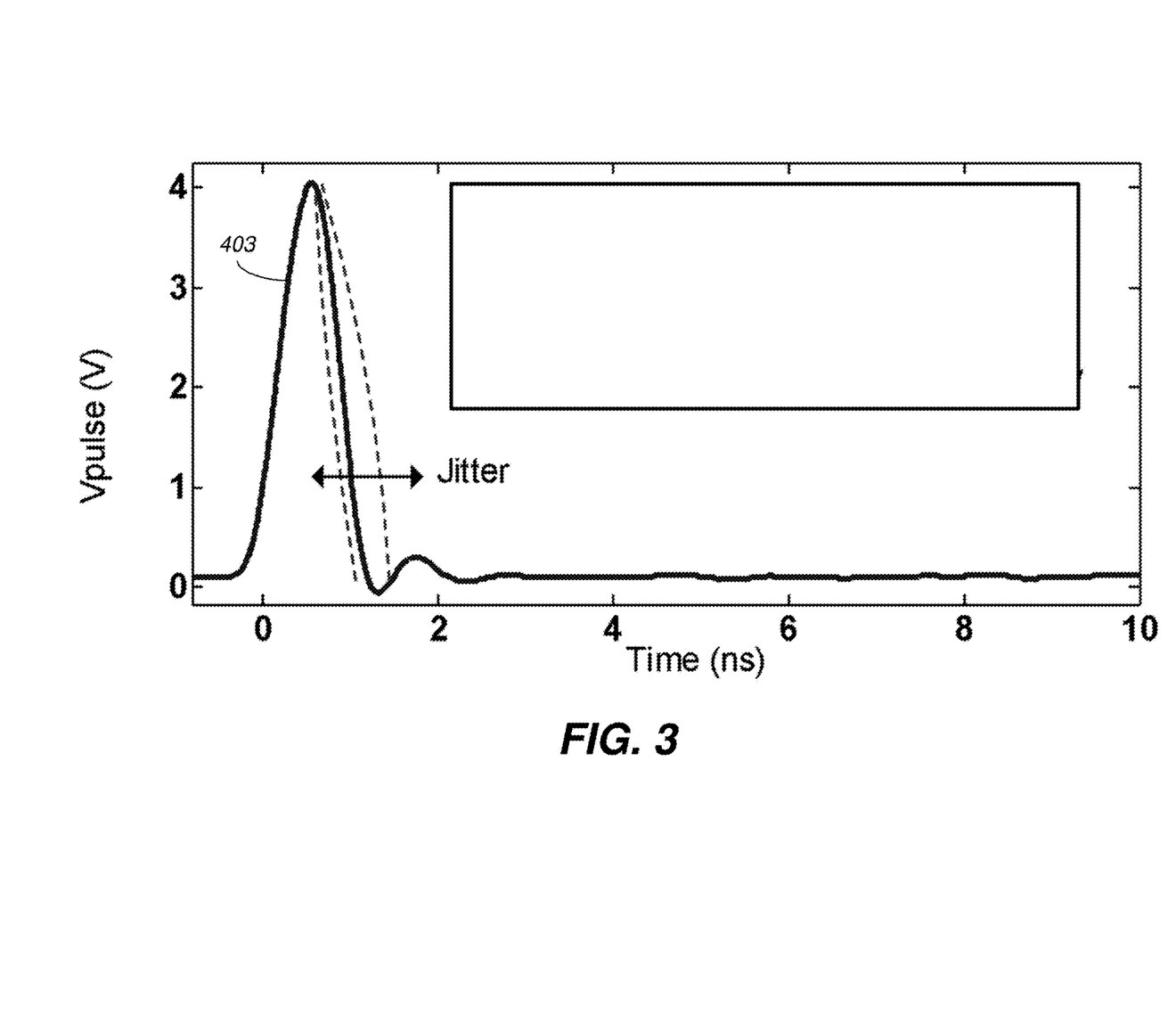
FIG. 3 is a plot showing an injected pulse to a monitoring resonator according to various aspects.
Figure 4:
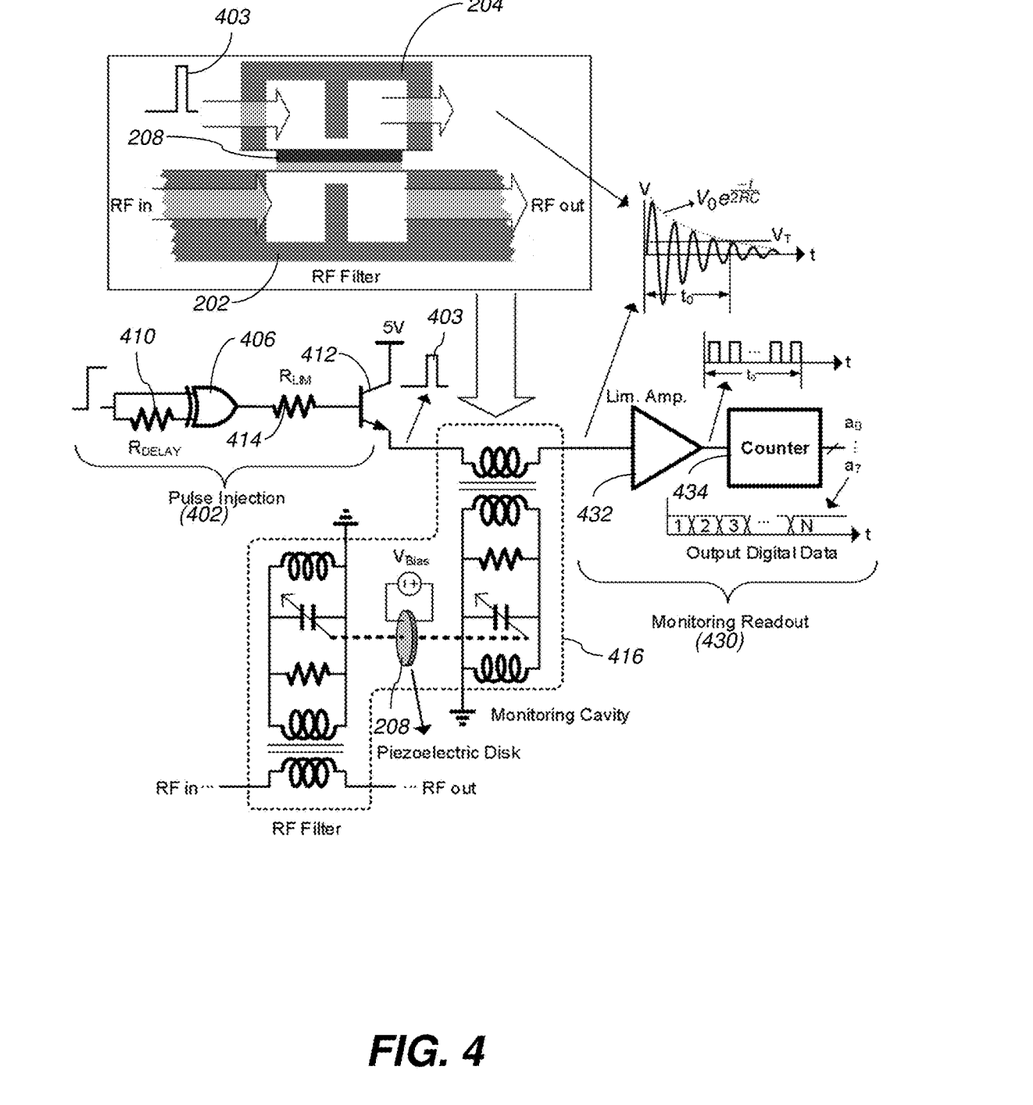
FIG. 4 is a schematic diagram of a filter monitoring system according to various aspets.

In order to excite the monitoring resonator 204, a pulse injection circuit 402 is provided as shown in FIG. 4. The pulse injection circuit 402 generates a current pulse 403 to excite the monitoring resonator 204. In one embodiment, the pulse is generated by applying a step waveform on one input of an XOR gate 406, and a delayed version of that step waveform to the other input of the XOR gate 406. In one embodiment, an RC circuit consisting of a series resistance ($R_{DELAY}$) and the input capacitance of the XOR gate 406 create the delay. The output of the XOR gate then drives a transistor 412 (shown here as an npn transistor, although other types may be used) through a current-limiting resistor 414 ($R_{LIM}$). The transistor 412 generates the current-pulse 403 at the input of the monitoring resonator 204. An example current-pulse 403 output of the pulse injection circuit 402 is shown in FIG. 3.

The frequency of the monitoring resonator 204 can be detected from the natural response of the filter. Therefore, the natural response should be analyzed. In order to study the response of the cavity to a pulse, the cavity needs to be modeled. The monitoring cavity resonator 204 can be modeled as a parallel RLC circuit 416, as shown in FIG. 4. When an RLC circuit is excited by a short current pulse (such as pulse 403), the natural voltage response is a damped sinusoid. The voltage across a high-Q parallel RLC circuit under natural response can be approximated as $$V_{RLC} = V_0 e^{\frac{-t}{2RC}} \sin(2\pi f_0 t + \theta). \tag{2}$$

where $V_0$ is a constant, t is time, R and C are the resistance and capacitance, $f_0$ is the natural frequency expressed in equation (1), and θ is the phase. This has been verified by simulating an RLC model circuit (using SPICE) when excited by the measured pulse from FIG. 3.

The current pulse from the pulse injection circuit 402 will typically exhibit jitter. Jitter can be caused by several mechanisms such as random additive noise. Additive noise can cause the logic gate (XOR 406) to trigger before or after the signal reaches the threshold, randomly. This causes different output pulse widths, which can change the response of the circuit. As a result, the monitoring resonator 204 should be designed such that the response is not significantly affected by jitter. The frequency of the monitoring resonator 204 is chosen such that the response is not largely affected by the jitter in the pulse, which becomes prominent at frequencies close to the inverse of the pulse width. On the other hand, the frequency of the monitoring resonator 204 cannot be too low because filter fabrication becomes problematic at low frequencies due to size requirements. As a result, the frequency of the monitoring resonator 204 should preferably be chosen between those two limits. If the aforementioned limitations on the monitoring resonator 204 define a range smaller than the tuning range (limited by the piezoelectric actuator 208), the upper limit can be further moved to higher frequencies by using a pulse injection circuit 402 that can provide a smaller pulse width ($T_{pulse}$).

The natural frequency response of the monitoring resonator 204 is needed to determine the frequency of the filter resonator 202. When tuning the filter 200, the capacitance C changes, which, in turn, changes the natural response waveform in equation (2). This change can be detected by counting the number of cycles above a voltage threshold in the damped response, as shown in FIG. 4. This can be expressed analytically as $$N = f_{mon} t_0. \qquad (3)$$

where N is the number of cycles above the threshold, $t_0$ is the time it takes for the signal to go below the threshold, and $f_{mon}$ is the natural resonant frequency of the monitoring resonator 204. Given that the sinusoidal component in equation (2) has a unity maximum, $t_0$ can be found by solving $$V_0 e^{\frac{-t_0}{2RC}} = V_T \qquad (4)$$

where $V_T$ is the threshold voltage. From equation (4), $t_0$ can be found to be $$t_0 = 2RC \ln\left(\frac{V_0}{V_T}\right) \qquad (5)$$

From equations (1), (3) and (5), the relationship between the number of cycles and natural resonant frequency of the monitoring resonator 204 is given by $$N = \frac{2R}{(2\pi)^2 f_{mon} L} \ln\left(\frac{V_0}{V_T}\right) \qquad (6)$$

From equation (6), it can be seen that, in the natural response of a cavity, the number of cycles that are above a voltage threshold ($V_T$) is inversely proportional to the resonant frequency. This relationship is also monotonic and bijective, which allows it to be used for monitoring.

Since the number of cycles N is inversely proportional to the monitoring resonator 204 frequency (N$\alpha 1/f_{mon}$), and since the monitoring resonator 204 frequency is inversely proportional to the filter resonator 202 ($f_{mon} \alpha 1/f_{RF\ cav}$), the number of cycles N is directly proportional to the filter resonator 202 frequency (N$\alpha f_{RF\ cav}$).

As shown in FIG. 4, a readout circuit 430 outputs the number of cycles above a voltage threshold in the signal output from the monitoring resonator 204. In one embodiment, the readout circuit 430 comprises a limiting amplifier 432 as the input stage. The limiting amplifier 432 outputs a signal with a constant amplitude as long as the input is larger than the set threshold. The output of the limiting amplifier 432 drives a high-speed ripple counter 434 to count the number of cycles.

When a pulse 403 is injected into the monitoring resonator 204, the counter 434 provides the number of cycles observed in the damped response. As discussed herein, the number of pulses can identify the resonant frequency of the monitoring resonator 204. As a result, the frequency of the filter resonator 202 is determined as well.

In certain embodiments, the monitoring readout circuit 430 outputs the number of pulses output from the monitoring resonator 204 in digital form, easing the integration of the readout in a control system.

Figure 5:
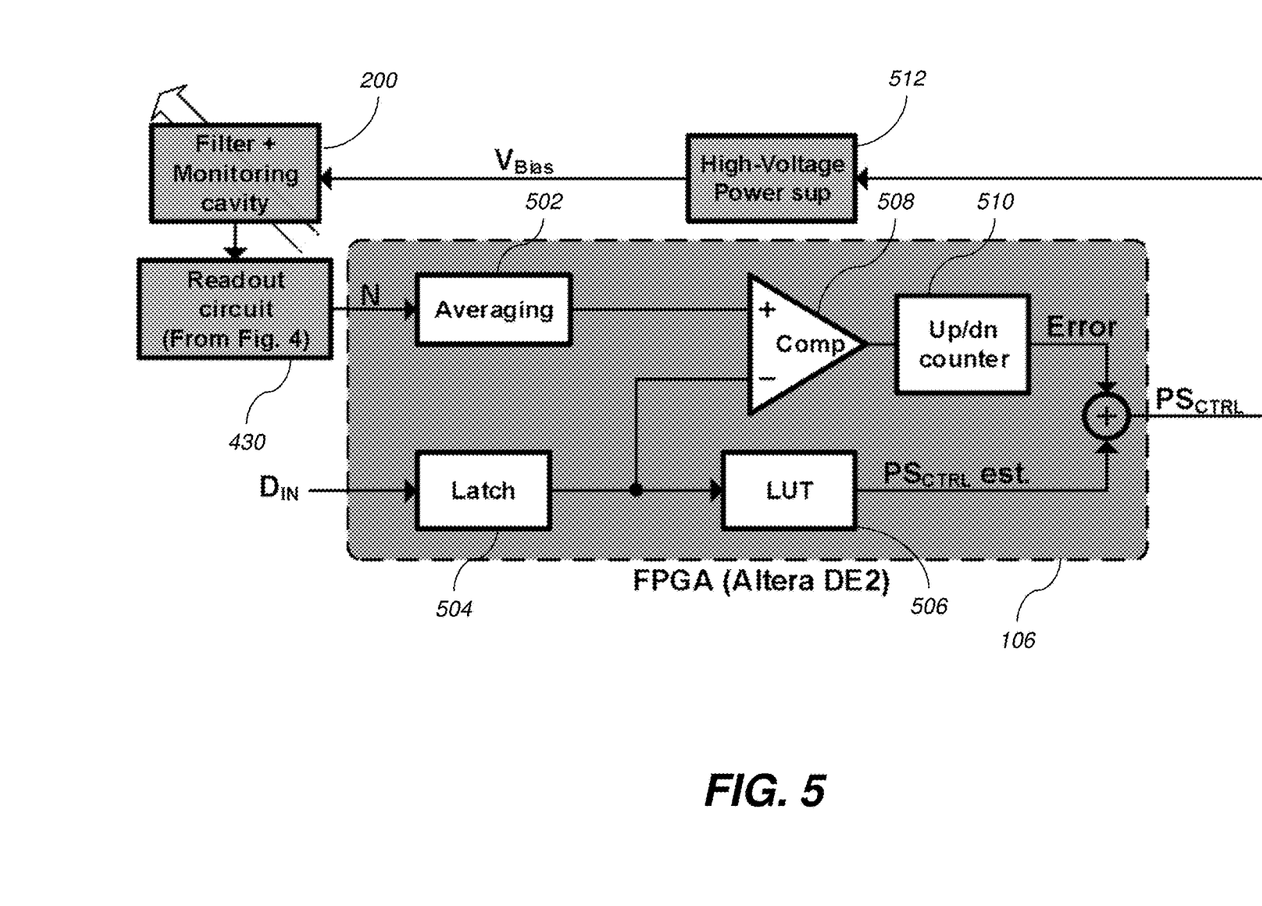
FIG. 5 is a schematic block diagram of a feedback control circuit according to various aspects.

FIG. 5 shows one embodiment of the feedback control circuit 106 which provides tuning of each pole in the filter 200 to a desired frequency, and to maintain that tuning regardless of memory effects such as hysteresis or creep. To accomplish this, the control circuit 106 changes the power supply that generates the bias voltage of the piezoelectric disk 208 based on the frequency reading from the readout circuit 430.

As shown in FIG. 5, the control circuit 106 takes two inputs, the readout (N) from the readout circuit 430 and a digital number ($D_{IN}$) representing the desired operating frequency. The input received from the readout circuit 430 is first averaged (using averaging unit 502) to suppress any noise in the monitoring reading. Experiments show that averaging over 32k samples seems sufficient for the data to be stable and flicker free. Also, the data input ($D_{IN}$) is latched (using latch 504) and sent to a look-up-table (LUT unit 506) to generate an initially estimated control signal to the power supply ($PS_{CTRL}$ est.). This speeds up the process of generating the correct control signal to the power supply. The averaged readout data are then compared with $D_{IN}$ using a binary magnitude comparator 508. If they are not equal, as desired, a counter 510 generates an error signal (positive or negative) which will be added to the estimated signal. This will change control signal ($PS_{CTRL}$) of the power supply 512 (which is connected to the piezoelectric disk 208 to supply the voltage bias to the disk 208). The error signal will keep increasing (or decreasing if negative) until the averaged readout data is equal to the desired input data ($D_{IN}$). At that point, the power supply control signal $PS_{CTRL}$ has adjusted the power supply 512 to generate the piezoelectric bias signal $V_{Bias}$ that would correspond to the desired operating frequency of the filter 200. If the frequency of the filter resonator 202 is changed due to creep or any other environmental perturbations, it will change the readout signal (N). This will cause the control circuit 106 to change the error signal until the operating frequency of the filter 200 is corrected automatically.

In certain embodiments, the control circuit 106 is fully digital can therefore be implemented in a microcontroller or a field programmable gate array (FPGA) platform.

Figure 6:
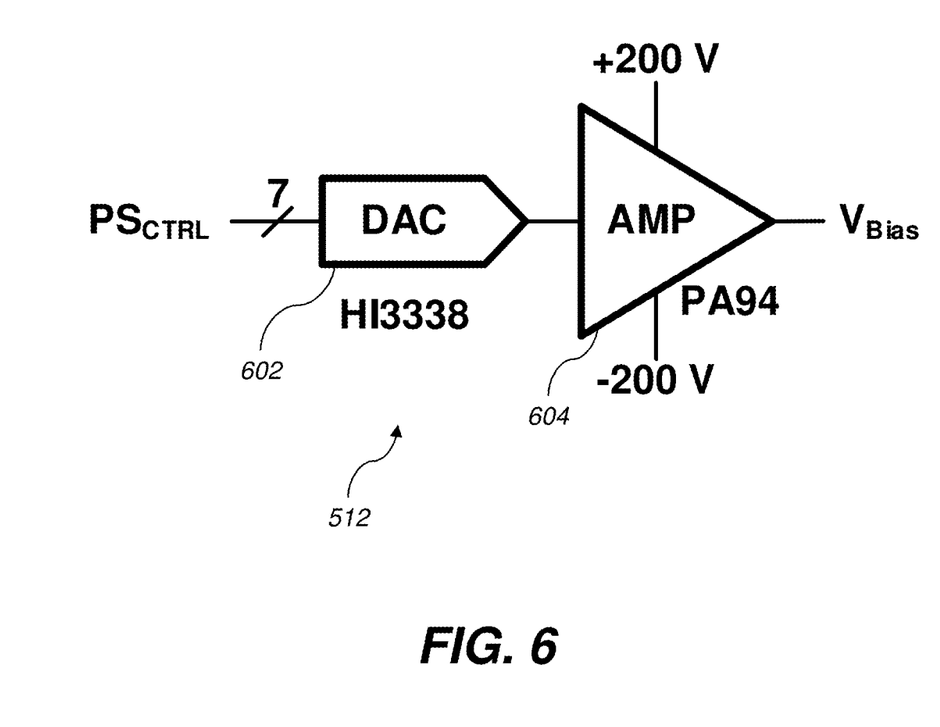
FIG. 6 is a schematic block diagram of a power supply circuit according to various aspects.

In certain embodiments, to ease the integration of the system, the power supply 512 may be controlled digitally and should be capable of generating high voltage bias for the piezoelectric disk 208. FIG. 6 shows one embodiment of the power supply 512 which comprises a Digital-to-Analog converter (DAC) 602 and amplifier 604. The DAC 602 receives the power supply control signal ($PS_{CTRL}$) and converts the signal to an analog low-voltage replica of the desired voltage. The output of DAC 602 is directed to the high voltage amplifier 604. The output of the amplifier 604 is then directed to the piezoelectric disk 208 as shown in FIG. 6.

Steps of various methods described herein can be performed in any order except when otherwise specified, or when data from an earlier step is used in a later step. Exemplary method(s) described herein are not limited to being carried out by components particularly identified in discussions of those methods.

According to various aspects, technical effects can include the capability of measuring an operating frequency of a pole of a filter in real time with relatively low cost devices. In preferred embodiments, the frequency response of each pole in a filter can be measured using simple circuitry using off-the-shelf electronics that can be embedded in a system with reduced power consumption overhead, resulting in a relatively inexpensive solution in comparison to conventional techniques tuned with lab equipment. Also, these methods preferably provide the frequency information in a digital format, and without affecting the main cavity operation.

Various aspects described herein may be embodied as systems or methods. Accordingly, various aspects herein may take the form of an entirely hardware aspect, an entirely software aspect (including firmware, resident software, micro-code, etc.) run by one or more computer processors connected to electronic memory, or an aspect combining software and hardware aspects These aspects can all generally be referred to herein as a "service," "circuit," "circuitry," "module," or "system."

Furthermore, various aspects herein may be embodied as computer program products including computer readable program code ("program code") stored on a computer readable medium, e.g., a tangible non-transitory computer storage medium or a communication medium. A computer storage medium can include tangible storage units such as volatile memory, nonvolatile memory, or other persistent or auxiliary computer storage media, removable and non-removable computer storage media implemented in any method or technology for storage of information such as computer-readable instructions, data structures, program modules, or other data. A computer storage medium can be manufactured as is conventional for such articles, e.g., by pressing a CD-ROM or electronically writing data into a Flash memory. In contrast to computer storage media, communication media may embody computer-readable instructions, data structures, program modules, or other data in a modulated data signal, such as a carrier wave or other transmission mechanism. As defined herein, "computer storage media" do not include communication media. That is, computer storage media do not include communications media consisting solely of a modulated data signal, a carrier wave, or a propagated signal, per se.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless otherwise explicitly noted. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected within the spirit and scope of the invention.

The invention claimed is:

1. An evanescent-mode RF filter, comprising:
an RF filter resonator having a first membrane enclosing a first cavity;
a monitoring resonator having a second membrane enclosing a second cavity, the monitoring resonator mounted opposing the filter resonator such that the first and second membranes are facing one another;
a planar actuator mounted between the first and second membranes, wherein the planar actuator comprises a piezoelectric element, wherein the piezoelectric element is electrically isolated from the first membrane and the second membrane by an electrically insulating material; and
a power supply configured to apply a voltage bias signal to the actuator, the voltage bias signal causing the actuator to increase or decrease the operating frequency of the filter resonator;
a pulse injection circuit operatively connected to an input of the monitoring resonator, the pulse injection circuit configured to supply a pulse signal to the monitoring resonator;
a readout circuit connected to an output of the monitoring resonator, the readout circuit configured to determine a number of pulses from the output having a voltage greater than a predetermined threshold in a predetermined time period, the number of pulses corresponding to a natural response frequency of the filter resonator in response to the pulse signal, wherein the readout circuit outputs a value in a binary digital format, the value corresponding to said number of pulses; and
a feedback control circuit, the feedback control circuit having an input configured to receive output from the readout circuit and an output operatively connected to the power supply, the feedback control circuit configured to tune the filter to a desired operating frequency.

2. The filter of claim 1, wherein the piezoelectric element comprises a disk, and wherein the filter resonator and the monitoring resonator are circular.

3. The filter of claim 1, wherein the filter comprises a plurality of filter resonators and monitoring resonators, each of the filter resonators connected to a corresponding monitoring resonator.

4. The filter of claim 1, wherein the filter is a band-stop filter.

5. The filter of claim 1, further comprising:
an antenna connected to an input of the filter resonator; and
an RF receiver connected to an output of the filter resonator.

* * * * *